United States Patent
Jang

(10) Patent No.: US 7,498,220 B2
(45) Date of Patent: Mar. 3, 2009

(54) METHODS OF FABRICATING SEMICONDUCTOR MEMORY DEVICES INCLUDING DIFFERENT DIELECTRIC LAYERS FOR THE CELL TRANSISTORS AND REFRESH TRANSISTORS THEREOF

(75) Inventor: Soon-kyou Jang, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 305 days.

(21) Appl. No.: 11/042,495

(22) Filed: Jan. 25, 2005

(65) Prior Publication Data

US 2005/0158951 A1 Jul. 21, 2005

Related U.S. Application Data

(62) Division of application No. 10/421,240, filed on Apr. 23, 2003, now Pat. No. 6,867,445.

(30) Foreign Application Priority Data

Jul. 10, 2002 (KR) ............................ 2002-0040091

(51) Int. Cl.
*H01L 21/8242* (2006.01)
(52) U.S. Cl. ...................................... 438/241
(58) Field of Classification Search ................ 438/981, 438/241, 258
See application file for complete search history.

(56) References Cited

U.S. PATENT DOCUMENTS 6,268,748 B1 7/2001 Bertin et al.
6,287,912 B1 * 9/2001 Asakura et al. ............. 438/241
2003/0054613 A1 3/2003 Murakami et al.

FOREIGN PATENT DOCUMENTS

KR 2002-0030702 A 4/2002

OTHER PUBLICATIONS

Notice to Submit Response, Korean App. No. 10-2002-0040091, Apr. 30, 2004.

* cited by examiner

*Primary Examiner*—Jack Chen
(74) *Attorney, Agent, or Firm*—Myers Bigel Sibley & Sajovec, P.A.

(57) ABSTRACT

Semiconductor memory devices include memory cell transistors having spaced apart memory cell transistor source and drain regions, and a memory cell transistor insulated gate electrode that includes a memory cell transistor gate dielectric layer. Refresh transistors also are provided that are connected to the memory cell transistor insulated gate electrodes and are configured to selectively apply negative bias to the memory cell transistor insulated gate electrodes in a refresh operation. The refresh transistors include spaced apart refresh transistor source and drain regions, and a refresh transistor insulated gate electrode. The refresh transistor insulated gate electrode includes a refresh transistor gate dielectric layer that is of different thickness that the memory cell transistor gate dielectric layer. The refresh transistor gate dielectric layer may be thinner than the memory cell transistor gate dielectric layer.

10 Claims, 6 Drawing Sheets

METHODS OF FABRICATING SEMICONDUCTOR MEMORY DEVICES INCLUDING DIFFERENT DIELECTRIC LAYERS FOR THE CELL TRANSISTORS AND REFRESH TRANSISTORS THEREOF

RELATED APPLICATIONS

This application is a divisional of application Ser. No. 10/421,240, filed Apr. 23, 2003, now U.S. Pat. No. 6,867,445 which itself claims the benefit of Korean Patent Application No. 2002-0040091, filed Jul. 10, 2002, both of which are assigned to the assignee of the present application, the disclosures of which are hereby incorporated herein by reference in their entirety as if set forth fully herein.

FIELD OF THE INVENTION

The present invention relates to semiconductor memory devices and methods for manufacturing the same, and more particularly to semiconductor memory devices having a cell area and a peripheral area, and to methods for manufacturing transistors which are formed in the peripheral area and the cell area.

BACKGROUND OF THE INVENTION

Integrated circuit memory devices are widely used in consumer and commercial applications. As is well known to those having skill in the art, one type of integrated circuit memory device is a Dynamic Random Access Memory (DRAM). In a DRAM, data is stored as charge on a capacitor. Since the charge dissipates over time, a conventional refresh operation is periodically performed to retain the stored data.

As is also known to those having skill in the art, a semiconductor memory device may be divided into a cell area, in which memory cells are formed, and a peripheral area. In the cell area, memory cells composed of transistors arranged in an array and capacitors coupled to the transistors are formed. Transistors having different functions are formed in the peripheral area including a column decoder and a row decoder that control the input and output of information to and from the memory cells in the cell area.

As the integration density of semiconductor memory devices continues to increase, the reduced size of transistors may reduce operational voltages. This may impact the refreshing characteristics of memory cells. Historically, cell transistors of the memory cells are generally maintained at a voltage of 0V in an unapplied voltage state. However, it has been found that application of a negative bias to the cell transistors may be efficient for refreshing, so that the cell transistors are kept at a negative level to reduce an off state current of unselected cell transistors. Accordingly, it is known to include additional gate negative-bias transistors, also referred to herein as refresh transistors, in the peripheral area.

As shown in FIG. 8, since the gate negative-bias transistors are formed in a peripheral area P adjacent to the cell area C, the gate negative-bias transistors may be affected by the memory cells in the cell area C during a manufacturing process. The design and operation of a conventional semiconductor memory device of FIG. 8 is well known to those having skill in the art and need not be described further herein.

Memory cells generally include insulated gate field effect transistors, conventionally referred to as MOS transistors, that are highly integrated in a matrix form to occupy relatively small areas. MOS transistors, which occupy relatively large areas, are formed in the peripheral areas. Since the MOS transistors that apply negative biases to gates of cell transistors are connected to back bias voltages VBB2 in an off state, they may need to be adjusted to a high threshold voltage Vt.

SUMMARY OF THE INVENTION

Some embodiments of the present invention provide semiconductor memory devices that include a plurality of memory cell transistors comprising spaced apart memory cell transistor source and drain regions, and a memory cell transistor insulated gate electrode therebetween that includes a memory cell transistor gate dielectric layer. A plurality of refresh transistors also are provided that are connected to the memory cell transistor insulated gate electrodes and are configured to selectively apply negative bias to the memory cell transistor insulated gate electrodes in a refresh operation. The refresh transistors comprise spaced apart refresh transistor source and drain regions, and a refresh transistor insulated gate electrode therebetween. The refresh transistor insulated gate electrode includes a refresh transistor gate dielectric layer that is of different thickness than the memory cell transistor gate dielectric layer. In some embodiments, the refresh transistor gate dielectric layer is thinner than the memory cell transistor gate dielectric layer.

In other embodiments, a plurality of peripheral circuit transistors also are provided that are configured to control operations of the memory cell transistors. The plurality of peripheral circuit transistors includes spaced apart peripheral circuit transistor source and drain regions, and a peripheral circuit transistor insulated gate electrode therebetween. The peripheral circuit transistor insulated gate electrode includes a peripheral circuit transistor gate dielectric layer of same thickness as the memory cell transistor gate dielectric layer.

According to other embodiments of the present invention, there is provided a semiconductor memory device including a cell area, in which memory cells are located, and a peripheral area, which is located outside the cell area. The semiconductor memory device includes a plurality of cell transistors, a plurality of peripheral circuit or core transistors, and a plurality of gate negative-bias transistors. The plurality of cell transistors are located in the cell area to serve as memory cells and include gates, source/drain regions on opposite sides of the gates, and a first gate dielectric layer having a first thickness. The plurality of core transistors are located in the peripheral area and include the first gate dielectric layer having the first thickness. The plurality of gate negative-bias transistors include a second gate dielectric layer having a second thickness different from the first thickness and arranged in the peripheral area to apply negative bias to the gates of the cell transistors. In some embodiments, the gate negative-bias transistors are electrically connected to the gates of the cell transistors.

In some embodiments, the first gate dielectric layer is thicker than the second dielectric layer, and in some embodiments, the threshold voltages of the cell transistors and threshold voltages of the core transistors in the peripheral area may be made identical. For ease in manufacturing and good layer quality, the first and second gate dielectric layers may be silicon oxide layers formed by thermally oxidizing the semiconductor substrate. In other embodiments, the first gate dielectric layer comprises dual silicon oxide dielectric layers and the second gate dielectric layer comprises a single silicon oxide layer, so that dielectric layers having different thicknesses can be formed on the semiconductor substrate.

Semiconductor memory devices may be fabricated according to embodiments of the present invention, by defining a memory cell area and a refresh gate bias transistor area in a semiconductor substrate. A memory cell transistor gate dielectric layer is formed in the memory cell area and a refresh gate bias transistor dielectric layer that is of different thickness than the memory cell transistor gate dielectric layer is formed in the refresh gate bias transistor area. Memory cell source and drain regions and memory cell gate electrodes are formed in the memory cell area and refresh gate bias transistor source and drain regions and refresh gate bias transistor gate electrodes are formed in the refresh transistor area. In some embodiments, the steps of forming the gate dielectric layers and the transistors may at least partially overlap.

According to other method embodiments of the present invention, isolation dielectric layers are formed in a semiconductor substrate to define active regions of a cell area, a peripheral area, and a gate negative-bias area. A first gate dielectric layer is formed in the active regions of the cell area and the peripheral area and a second gate dielectric layer is formed in the gate negative-bias area. Gate electrodes are formed in the active regions.

In some embodiments, the first and second gate dielectric layers may be formed by exposing the active regions. The first gate dielectric layer is formed in the exposed active regions by oxidizing the semiconductor substrate. The semiconductor substrate is then masked to expose the gate negative-bias area. The first dielectric layer formed in the gate negative-bias area is removed. A second dielectric layer is formed in the active regions of the cell area in which the first dielectric layer remains and in the peripheral area and the gate negative-bias area in which the semiconductor substrate is exposed. Thus, thick first gate dielectric layers comprising first dielectric layers and second dielectric layers are formed in the cell area and the active regions of the peripheral area. Thin second gate dielectric layers comprising second dielectric layers are formed in the gate negative-bias area of the peripheral area.

After the first and second gate dielectric layers are formed, gate conductive layer patterns are formed on the semiconductor substrate. For example, a photoresist having gate patterns is formed on gate conductive layers. The gate patterns are transferred to the gate conductive layers by employing a dry etching method using the photoresist as a mask. In some embodiments, the gate conductive layers comprise doped polysilicon. The gate conductive layers may further include metal suicide layers so that line resistance can be reduced in the semiconductor memory device. Capacitors may be formed using a conventional process of manufacturing a semiconductor memory device and the semiconductor memory device may be completed using a conventional process such as metallization.

In semiconductor memory devices having the above-described structures according to some embodiments of the invention, differences in threshold voltages among cell transistors in a cell area and gate negative-bias transistors in a peripheral area due to the relative sizes of active regions may be reduced so that the threshold voltages may be made uniform. Also, in methods for manufacturing semiconductor memory devices according to some embodiments of the invention, cell transistors and gate negative-bias transistors including gate dielectric layers having different thicknesses on a semiconductor substrate may be simultaneously formed by performing a two-time gate oxide layer formation process and a one-time patterning process. Thus, the production yield of the semiconductor memory device can be improved.

DETAILED DESCRIPTION

Figure 1A:
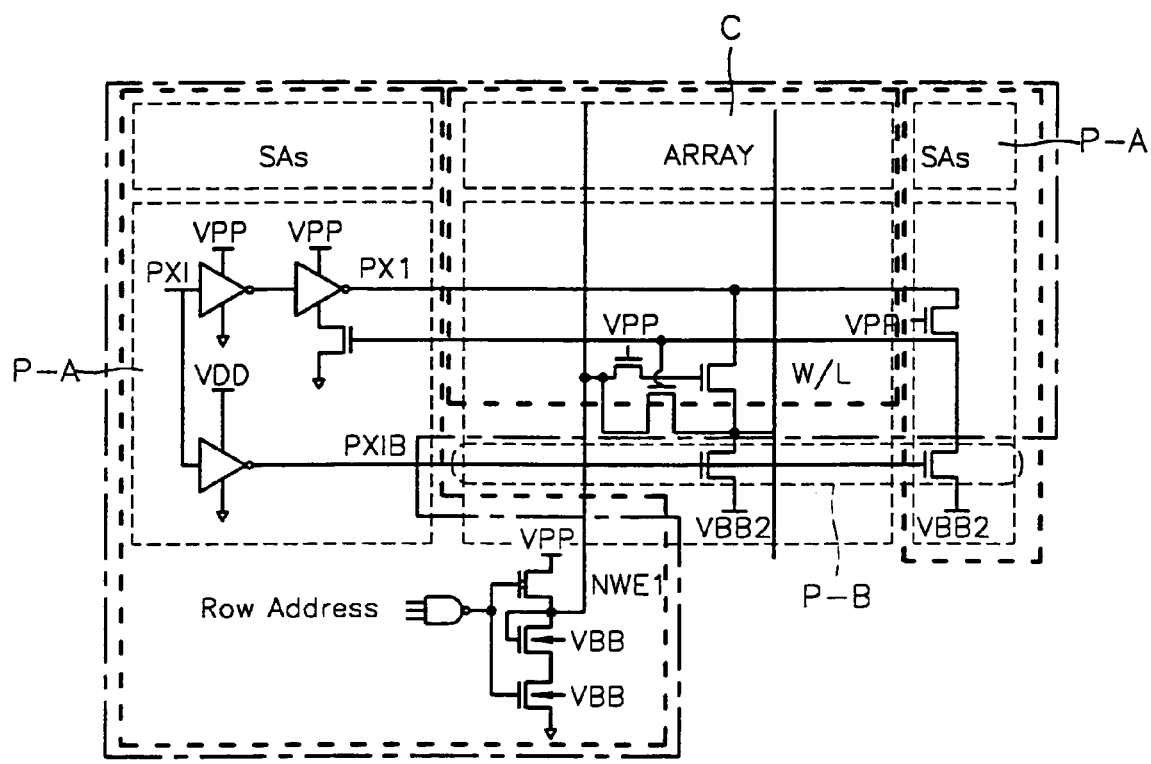
FIG. 1A is a circuit diagram illustrating an arrangement of transistors in a cell area and a peripheral area of semiconductor memory devices according to embodiments of the present invention.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1B:
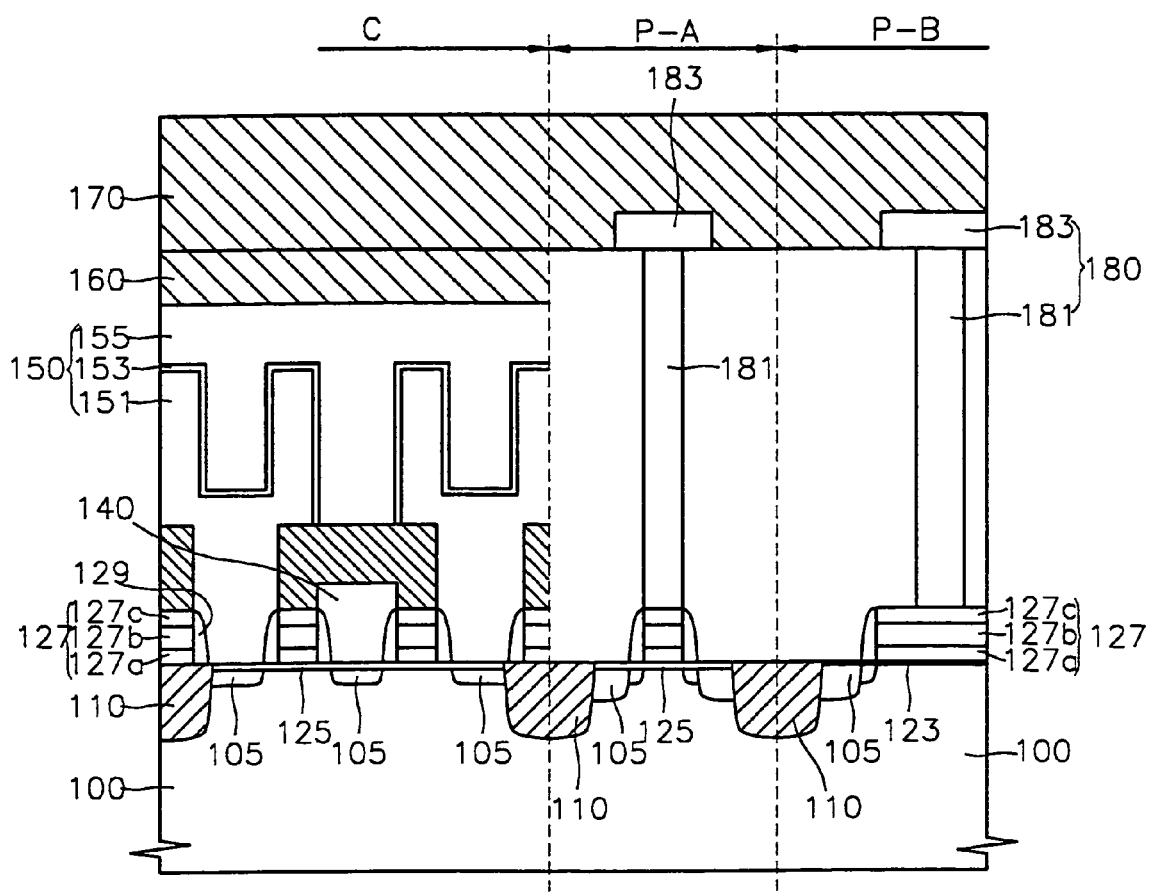
FIG. 1B is a cross-sectional view of semiconductor memory devices according to embodiments of the present invention.

FIG. 1A is a circuit diagram of semiconductor memory devices according to some embodiments of the present invention, and FIG. 1B is a cross-sectional view of semiconductor devices according to some embodiments of the present invention. In FIGS. 1A and 1B, an active region is divided into a cell area C, a peripheral area P-A, and a gate negative-bias area P-B. In some embodiments, the gate negative-bias area P-B is substantially adjacent to the cell area C. However, for ease of explanation, the cell area C, the peripheral area P-A, and the negative-bias area P-B are sequentially arranged from left to right in FIG. 1B.

Referring to FIGS. 1A and 1B, the semiconductor memory device includes isolation insulating layers 110, a first gate dielectric layer 125, a second gate dielectric layer 123, gates 127, source and drain regions 105, bit lines 140, and capacitors 150. The isolation insulating layers 110 are formed in a semiconductor substrate 100 and define a cell area C, a peripheral area P-A, and an active region of a gate negative-bias area P-B in which gate negative-bias transistors are formed so as to apply negative bias to gates of MOS transistors formed in the cell area C. The first gate dielectric layer 125 has a first thickness in the active region in the cell area C and in the peripheral area P-A. The second gate dielectric layer 123 has a second thickness in the active region in the gate negative-bias area P-B. The gates 127 include gate conductive layers 127a and 127b on the first and second gate dielectric layers 125 and 123, mask insulating layers 127c on the gate conductive layers 127a and 127b, and insulating spacers 129 on the sidewalls of the gates 127. The source and drain regions 105 are provided in the active region on opposite sides of the gates 127. The bit lines 140 are formed so as to be connected to the drains 105 and extend orthogonal to the gates 127. The capacitors 150 comprise storage electrodes 151 that are lower electrodes, dielectric layers 153, and plate electrodes 155 that are upper electrodes.

In these embodiments, the isolation insulating layers 110 comprise silicon oxide layers that are fabricated using a trench isolation method. The gate conductive layers 127a and 127b may be single layers consisting only of doped polysilicon. However, in other embodiments, the gate conductive layers 127a and 127b may be dual layers comprising polysilicon layers 127a and metal silicide layers 127b to reduce sheet resistance that may otherwise increase with a decrease in the line widths of the gates 127 due to the high integration of the semiconductor device. The metal silicide layers 127b may include tungsten silicide (WSi), titanium silicide (TiSi), cobalt silicide (CoSi) and/or molybdenum silicide (MoSi).

The first and second gate dielectric layers 125 and 123 may generally comprise silicon oxide ($SiO_2$) layers and/or silicon oxynitride layers (SiON). The silicon oxide layers may be formed by thermally oxidizing portions of the semiconductor substrate 100 in the active regions.

In some embodiments, the first gate dielectric layer 125 is thicker than the second gate dielectric layer 123. In some embodiments, a first dielectric layer having a first thickness is formed, and then a portion of the first dielectric layer in the gate negative-bias area P-B is removed using a wet cleaning process. Thermal oxidation is performed on the entire surface of the semiconductor substrate 100 to form a second dielectric layer. Thus, the first gate dielectric layer 125, having a second thickness, comprising the first and second dielectric layers is formed in the cell area C and the peripheral area P-A. The second gate dielectric layer 123 having the same thickness as the second dielectric layer is formed in the gate negative-bias area P-B. The first and second gate dielectric layers 125 and 123 having different thicknesses may be formed using double thermal oxidation. Alternatively, the first gate dielectric layer 125 may be formed using thermal oxidation and the second gate dielectric layer 123 may be formed of silicon oxide or oxynitride using chemical vapor deposition (CVD). Other conventional techniques may be used to form gate dielectric layers of different thicknesses. Reference numerals 160 and 170 in FIG. 1B denote interlayer insulating layers comprising silicon oxide.

Conventionally, MOS transistors including gates having the same thickness and gate dielectric layers having the same thickness are formed in semiconductor memory devices. Also, the same dose of ions is conventionally implanted into the cell area C and high voltage areas of the peripheral area P so that the MOS transistors in the cell area C and the peripheral areas P have the same threshold voltage. It has been found, however, that threshold voltages may be different in different areas in which transistors are formed. Specifically, since transistors in the cell area C have small areas per unit cell, the transistors may show short channel transistor effects. However, since high voltage negative-bias MOS transistors in the peripheral areas P have relatively larger areas than the cell transistors, the high voltage negative-bias MOS transistors may show bulk transistor characteristics. As a result, it has been found that threshold voltages in the cell area C may be different from threshold voltages in the peripheral areas P. Therefore, in a DRAM having a threshold voltage of 1.2-1.3 V, transistors having high voltages Vt in the core area may operate at a voltage higher than the cell transistors. Due to this effect, the semiconductor memory device may unstably operate, and thus, a soft error or an operation error may occur when inputting and outputting a signal to and from the memory cells.

In sharp contrast, embodiments of the present invention can provide semiconductor memory devices in which a soft error and/or an operation error can be reduced or prevented from occurring when inputting/outputting a signal to/from a highly integrated memory device by stabilizing threshold voltages of transistors that are disposed in a peripheral area that apply negative biases to gates of memory cell transistors in a cell area.

FIGS. 2 through 7 are cross-sectional views illustrating steps of methods for manufacturing semiconductor devices according to embodiments of the present invention.

Figure 2:
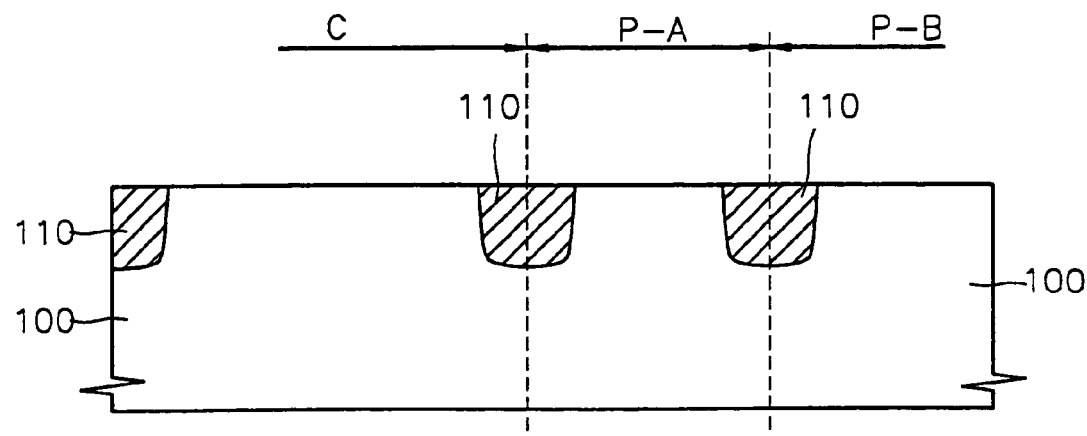
FIGS. 2 through 7 are cross-sectional views of sequential steps of methods for manufacturing semiconductor memory devices according to embodiments of the present invention.

Referring to FIG. 2, a mask insulating layer is formed on a semiconductor substrate 100, and then isolation patterns are formed on the mask insulating layer using a conventional patterning process. Trenches (overlapped with isolation oxide layers 110) are formed in the semiconductor substrate 100 using the isolation patterns as masks. An insulating layer is formed on the semiconductor substrate 100 to fully fill the trenches. A portion of the insulating layer in the active region is planarized using a planarization process such as chemical mechanical polishing. The mask insulating layer is removed using wet etching to define the active region. The isolation insulating layers 110 may be formed of silicon oxide using CVD. Other conventional isolation techniques may be used.

Figure 3:
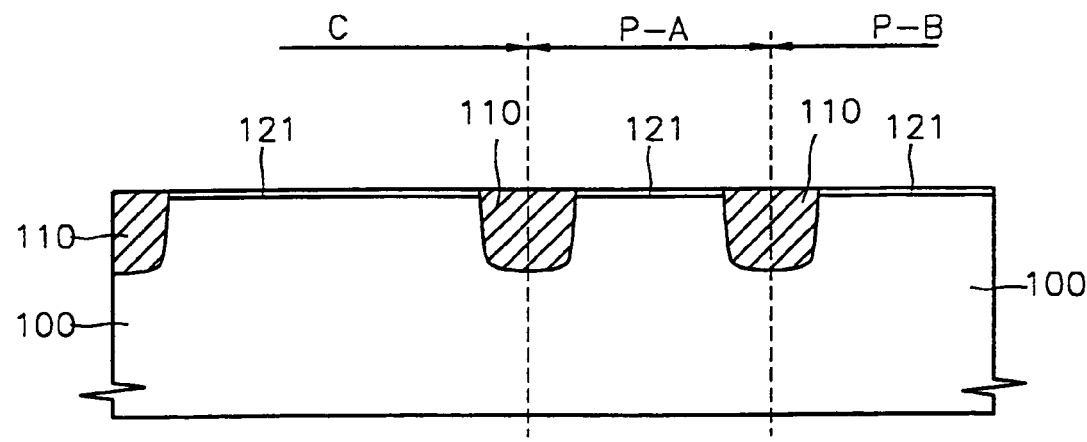

Referring to FIG. 3, a first dielectric layer 121 is formed to a first thickness in the active region of the semiconductor substrate 100 using a conventional process. In some embodiments, the first dielectric layer 121 may be a silicon oxide layer and/or a silicon oxynitride layer formed by thermally oxidizing the semiconductor substrate.

Figure 4:
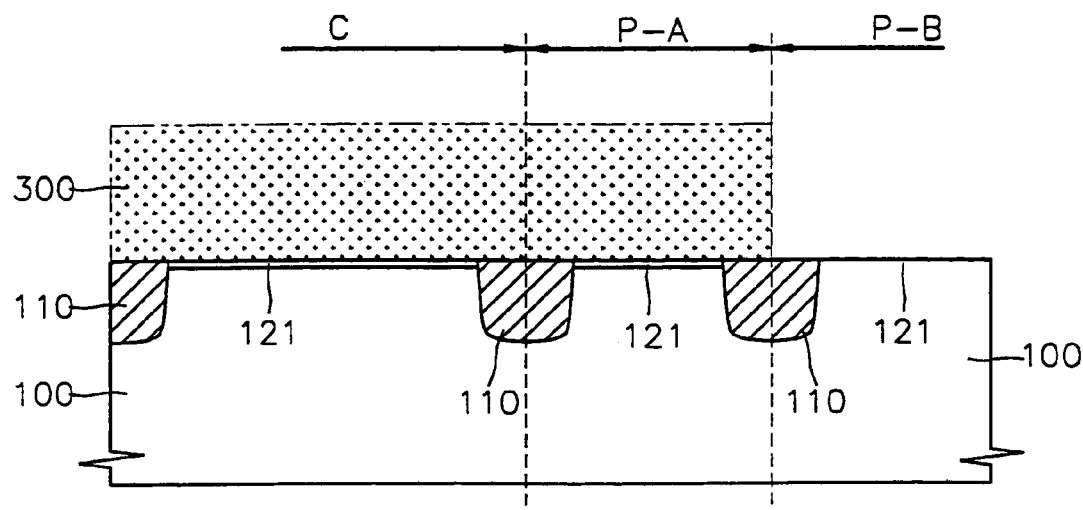

Referring to FIG. 4, only a portion of the dielectric layer 121 in the gate negative-bias area P-B is removed. In other words, a portion of the first gate dielectric layer 121 in a cell area C and a peripheral area P-A is protected from a patterning process using a photoresist 300. The exposed portion of the first dielectric layer 121 is removed by employing a predetermined etching process using the patterned photoresist 300 as a mask. In some embodiments, the portion of the first dielectric layer 121 in the cell area C and the peripheral area P-A remains and the portion of the first dielectric layer 121 in the gate negative-bias area P-B is completely removed. In other embodiments, it may only be partially removed, i.e., thinned.

Figure 5:
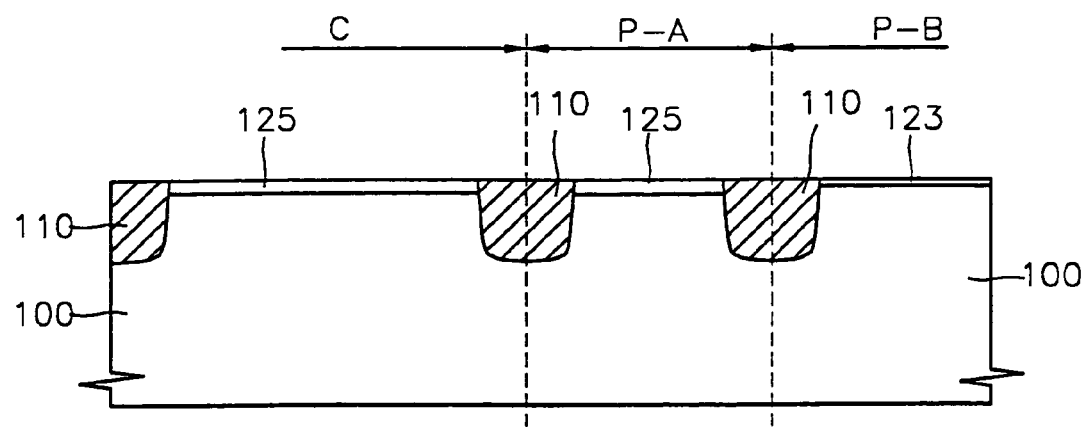

Referring to FIG. 5, a second dielectric layer 123 is formed on the surface of the semiconductor substrate 100. In some embodiments, the second dielectric layer 123 may be a silicon oxide ($SiO_2$) layer and/or an oxynitride (SiON) layer formed using thermal oxidation and/or CVD. Thus, the fist gate dielectric layer 125 comprising the first and second dielectric layers 121 and 123 is formed in the active region of the cell area C and the peripheral area P-A, and a second gate dielectric layer 123 composed of the second dielectric layer 123 is formed in the gate negative-bias area P-B. The first gate dielectric layer 125 is formed to a first thickness in the cell area C and the peripheral area P-A, and the second gate dielectric layer 123 is formed to a second thickness that is thinner than the first gate dielectric layer 125, in the gate negative-bias area P-B. Many other conventional techniques may be used to form dielectric layers of different thicknesses.

Figure 6:
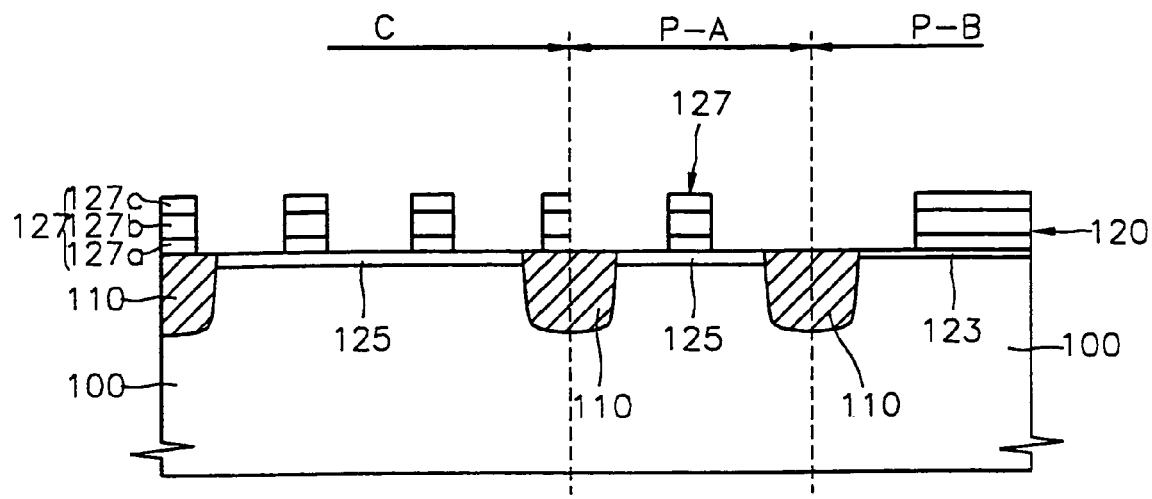

Referring to FIG. 6, as described previously, gate conductive layers 127a and 127b and mask insulating layers 127c are formed on the semiconductor substrate 100 in which the first and second gate dielectric layers 125 and 123 are formed in the active region. Gate patterns are formed on the gate conductive layers 127a and 127b and the mask insulating layers 127c using a predetermined patterning process to form gates 127. In some embodiments, if the gate conductive layers 127a are formed only of doped polysilicon using CVD, line resistance of the gates 127 may increase due to the high integration of the semiconductor device, which may lower a speed of processing a signal. Therefore, in order to reduce the line resistance of the gates 127, the gate conductive layers 127a may be formed by combining the gate conductive layers 127a and the silicide layers 127b. The mask insulating layers 127c are formed of silicon nitride using CVD and serve as etch masks when forming self-aligned contacts. Other conventional techniques may be used to form the gates.

Figure 7:
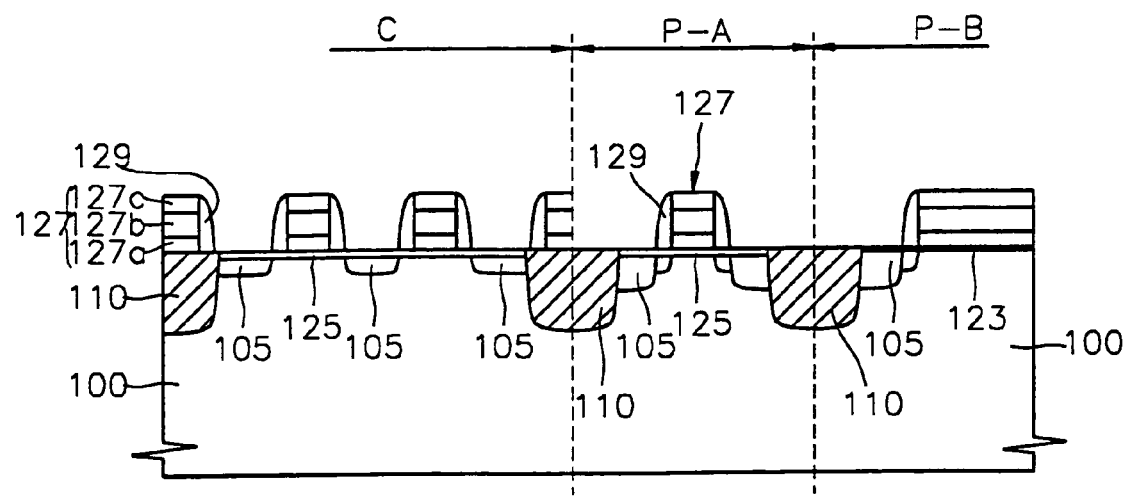
Figure 8:
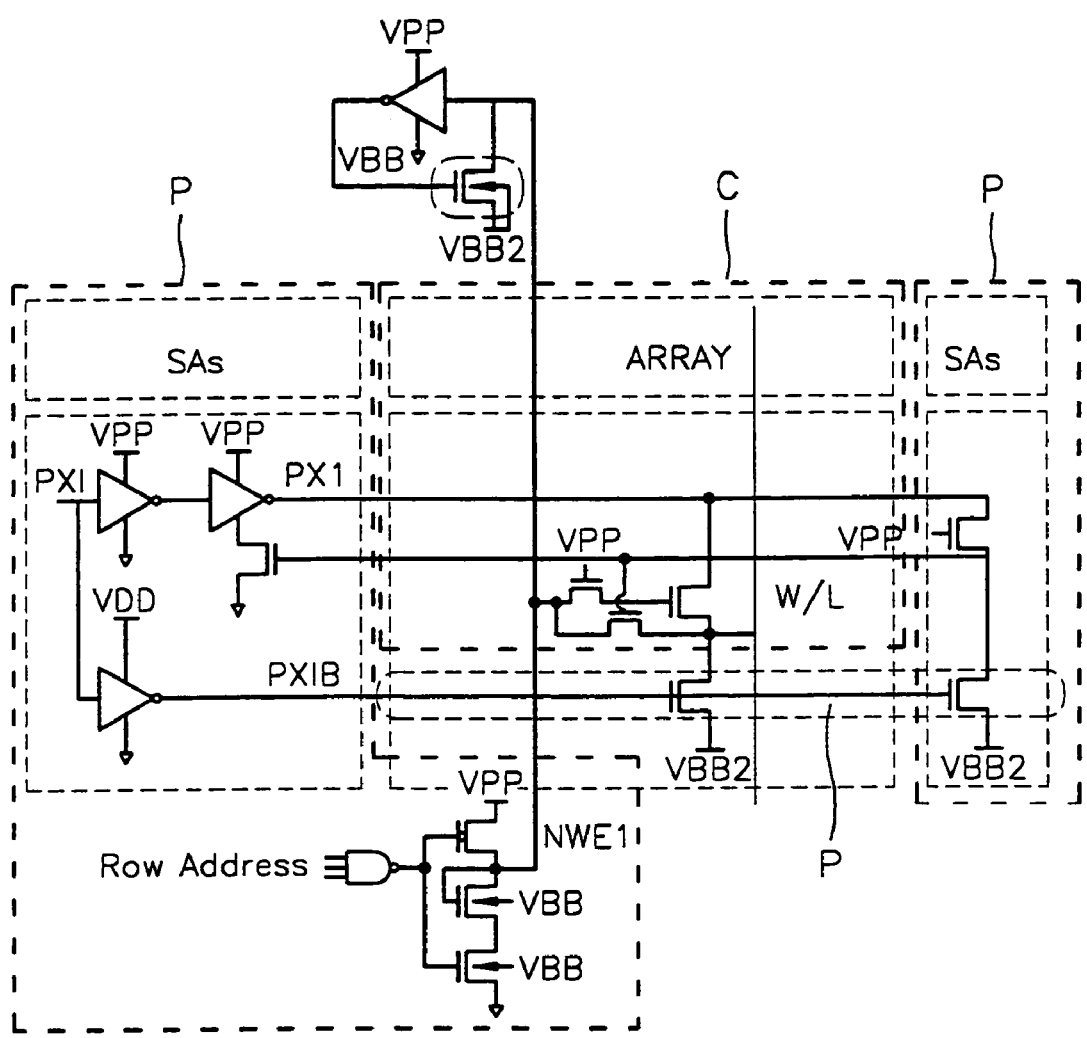
FIG. 8 is a circuit diagram illustrating an arrangement of transistors in a cell area and a peripheral area of a conventional semiconductor memory device.

Referring to FIG. 7, gate spacers 129 are formed on the sidewalls of the gates 127. In some embodiments, a silicon nitride layer is formed on the entire surface of the semiconductor substrate 100, and then remains only on the sidewalls of the gates 127 using anisotropic dry etching to form the gate spacers 129. Other conventional techniques may be used.

Source and drain junctions 105 are formed under both sidewalls of the gates 127. Then, the bit lines (140 of FIG. 1B) and the capacitors (150 of FIG. 1B) are formed. Metal interconnection lines (180 of FIG. 1B) are formed on the bit lines 140 and the capacitors 150 to complete a semiconductor memory device using a general semiconductor memory device manufacturing method. Many other conventional techniques may be used and the order of forming the various regions may change and/or overlap.

As described above, in semiconductor memory devices according to some embodiments of the present invention, the second gate dielectric layer 123 in the gate negative-bias area P-B is thinner than the first gate dielectric layer 125 in the cell area C and in the peripheral area P-A. Thus, errors in threshold voltages of transistors in the cell area C and the peripheral area P-A may be reduced so that the threshold voltages may be more uniformly distributed. Also, a soft error or an operation error can be remarkably reduced in memory cells of the semiconductor memory device. In addition, in methods for manufacturing semiconductor memory devices according to some embodiments of the present invention, gate dielectric layers having different thicknesses can be formed in the cell area C and the peripheral area P-A, and the gate negative-bias area P-B. Threshold voltages, which may be affected by peripheral devices during a process of manufacturing the semiconductor device, can be adjusted using a two-step process of forming the gate dielectric layers.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A method of fabricating a semiconductor memory device comprising:

defining a memory cell area and a refresh gate bias transistor area in a semiconductor substrate;

forming a memory cell transistor gate dielectric layer in the memory cell area and a refresh gate bias transistor gate dielectric layer that is of different thickness than the memory cell transistor gate dielectric layer in the refresh gate bias transistor area;

forming memory cell source and drain regions and memory cell gate electrodes in the memory cell area and refresh gate bias transistor source and drain regions and refresh gate bias transistor gate electrodes in the refresh gate bias transistor area; and connecting the refresh gate bias transistor source and drain regions in the refresh gate bias transistor area to the memory cell gate electrodes in the memory cell area so as to apply negative bias to the memory cell gate electrodes in the memory cell area.

2. The method of claim 1 wherein at least some of the step of forming memory cell source and drain regions and memory cell gate electrodes in the memory cell area and refresh gate bias transistor source and drain regions and refresh gate bias transistor gate electrodes in the refresh transistor area is performed prior to at least some of the step of forming a memory cell transistor gate dielectric layer in the memory cell area and a refresh gate bias transistor gate dielectric layer that is of different thickness than the memory cell transistor gate dielectric layer in the refresh gate bias transistor area.

3. The method according to claim 1 wherein the step of forming a memory cell transistor gate dielectric layer in the memory cell area and a refresh gate bias transistor gate dielectric layer that is of different thickness than the memory cell transistor gate dielectric layer in the refresh gate bias transistor area comprises:

forming a first dielectric layer in the memory cell area and in the refresh gate bias transistor area;

removing the first dielectric layer from the refresh gate bias transistor area; and forming a second dielectric layer in the refresh gate bias transistor area from which the first dielectric layer was removed.

4. The method according to claim 1 wherein the step of forming a memory cell transistor gate dielectric layer in the memory cell area and a refresh gate bias transistor gate dielectric layer that is of different thickness than the memory cell transistor gate dielectric layer in the refresh gate bias transistor area comprises forming a memory cell transistor gate dielectric layer in the memory cell area and a refresh gate bias transistor gate dielectric layer that is thinner than the memory cell transistor gate dielectric layer in the refresh gate bias transistor area.

5. The method according to claim 1 further comprising:

defining a peripheral circuit area in the semiconductor substrate;

forming a peripheral circuit transistor gate dielectric layer in the peripheral circuit area that is of same thickness as the memory cell transistor gate dielectric layer; and forming peripheral circuit transistor source and drain regions and peripheral circuit transistor gate electrodes in the peripheral circuit area.

6. The method according to claim 1 wherein the memory cell transistor gate dielectric layer and the refresh gate bias transistor gate dielectric layer comprise a same material of different thickness.

7. The method according to claim 1 wherein the memory cell transistor gate dielectric layer and the refresh gate bias transistor gate dielectric layer comprise different materials of different thickness.

8. The method of claim 1 wherein the memory cell transistor gate dielectric layer and the refresh gate bias transistor gate dielectric layer comprise silicon dioxide.

9. The method of claim 1 wherein the memory cell transistor gate dielectric layer comprises a silicon oxide layer or a silicon oxynitride layer.

10. The method of claim 1 wherein the memory cell transistor gate dielectric layer is fabricated using thermal oxidation.

* * * * *